(12) United States Patent
Hossain et al.

(10) Patent No.: US 11,476,185 B2
(45) Date of Patent: Oct. 18, 2022

(54) INNOVATIVE WAY TO DESIGN SILICON TO OVERCOME RETICLE LIMIT

(71) Applicant: Intel Corporation, Santa Clara, CA (US)

(72) Inventors: MD Altaf Hossain, Portland, OR (US); Dinesh Somasekhar, Portland, OR (US); Dheeraj Subbareddy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 16/481,421

(22) PCT Filed: Apr. 1, 2017

(86) PCT No.: PCT/US2017/025663
§ 371 (c)(1),
(2) Date: Jul. 26, 2019

(87) PCT Pub. No.: WO2018/182755
PCT Pub. Date: Oct. 4, 2018

(65) Prior Publication Data
US 2020/0176372 A1    Jun. 4, 2020

(51) Int. Cl.
*H01L 23/522* (2006.01)
*H01L 23/538* (2006.01)
(Continued)

(52) U.S. Cl.
CPC ........ *H01L 23/522* (2013.01); *H01L 23/5384* (2013.01); *H01L 23/5385* (2013.01);
(Continued)

(58) Field of Classification Search
CPC .............. H01L 23/4012; H01L 25/043; H01L 25/0756; H01L 25/117
See application file for complete search history.

(56) References Cited

U.S. PATENT DOCUMENTS 7,619,441 B1   11/2009   Rahman et al.
9,368,450 B1    6/2016   Gu et al.
(Continued)

OTHER PUBLICATIONS

International Search Report and Written Opinion for International Patent Application No. PCT/US2017/025663 dated Nov. 28, 2017, 12 pgs.

(Continued)

*Primary Examiner* — Fernando L Toledo
*Assistant Examiner* — Valerie N Newton
(74) *Attorney, Agent, or Firm* — Schwabe, Williamson & Wyatt, P.C.

(57) ABSTRACT

Embodiments of the invention include a stacked die system and methods for forming such systems. In an embodiment, the stacked die system may include a first die. The first die may include a device layer and a plurality of routing layers formed over the device layer. The plurality of routing layers may be segmented into a plurality of sub regions. In an embodiment no conductive traces in the plurality of routing layers pass over a boundary between any of the plurality of sub regions. In an embodiment, the stacked die system may also include a plurality of second dies stacked over the first die. According to an embodiment, at least a two of the second dies are communicatively coupled to each other by a die to die interconnect formed entirely within a single sub region in the first die.

23 Claims, 7 Drawing Sheets

(51) Int. Cl.
*H01L 25/065* (2006.01)
*H01L 23/00* (2006.01)
*H01L 25/07* (2006.01)

(52) U.S. Cl.
CPC .......... *H01L 24/16* (2013.01); *H01L 25/0652* (2013.01); *H01L 25/07* (2013.01); *H01L 2224/16225* (2013.01); *H01L 2225/06513* (2013.01); *H01L 2225/06517* (2013.01); *H01L 2225/06527* (2013.01); *H01L 2225/06541* (2013.01); *H01L 2924/15311* (2013.01)

(56) References Cited

U.S. PATENT DOCUMENTS

| | | |
|---|---|---|
| 10,727,185 B2 * | 7/2020 | Aleksov .................. H01L 24/14 |
| 2009/0020881 A1 | 1/2009 | Kim |
| 2011/0241208 A1 | 10/2011 | Mahajan et al. |
| 2014/0117552 A1 * | 5/2014 | Qian .................. H01L 23/53228 257/762 |
| 2015/0096798 A1 * | 4/2015 | Uzoh ...................... H01L 24/05 174/267 |
| 2015/0145141 A1 | 5/2015 | Uzoh et al. |
| 2018/0157782 A1 * | 6/2018 | Rossi .................. H01L 25/0655 |
| 2018/0184524 A1 * | 6/2018 | Xiong ............... H01L 23/49822 |

OTHER PUBLICATIONS

International Preliminary Report on Patentability for International Patent Application No. PCT/US2017/025663 dated Oct. 10, 2019, 11 pages.

\* cited by examiner

INNOVATIVE WAY TO DESIGN SILICON TO OVERCOME RETICLE LIMIT

CROSS-REFERENCE TO RELATED APPLICATION

This patent application is a U.S. National Phase Application under 35 U.S.C. § 371 of International Application No. PCT/US2017/025663, filed Apr. 1, 2017, entitled "INNOVATIVE WAY TO DESIGN SILICON TO OVERCOME RETICLE LIMIT," which designates the United States of America, the entire disclosure of which is hereby incorporated by reference in its entirety and for all purposes.

FIELD OF THE INVENTION

Embodiments of the invention are in the field of stacked semiconductor dies and, in particular, stacked semiconductor dies where the bottom die is larger than the reticle limit.

BACKGROUND OF THE INVENTION

High performance computing applications, such as servers, are driving an increase in the physical size of the die. However, the maximum size of the die may be limited by processing design rules. For example, the reticle limit used to fabricate the die cannot be exceeded without additional processing, which increases the overall cost of the die. Currently, when the reticle limit is not large enough to accommodate the entire size of the die, reticle stitching may be used. The use of stitching is not desirable for high volume manufacturing due to increases in cost of each die. The additional cost is due to the need for two masks for every layer in order to form the interconnects across the normal reticle boundaries. In addition to the cost of an additional mask layer, the addition of a mask layer increases the probability of overlay errors and may reduce the yield.

DETAILED DESCRIPTION OF THE INVENTION

Described herein are systems with a plurality of stacked dies where the bottom die is larger than the reticle limit and includes no stitching and methods of forming such stacked die systems. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the increased processing demands in high performance computing systems, such as servers, may require the growth of dies to sizes beyond the typical size of available reticles. In stacked die systems, increasing the size of the bottom die beyond the reticle limit may allow for more dies to be stacked on the bottom die. However, die stitching is currently needed to fabricate dies that are larger than the reticle limit. As noted above, the die stitching process increases the overall cost of each device and reduces throughput. Accordingly, embodiment of the invention include stacked dies where the bottom die is larger than the reticle limit but does not require stitching. Instead, embodiments of the invention allow for larger bottom dies without breaking the design rules by utilizing an interconnect that spans both the top and bottom die.

According to an embodiment, the bottom die may be an older generation process technology and the top die (or dies) may utilize advanced process technology. Accordingly, the bottom die may be used for lower speed processing operations and the top dies may be used for faster processing operations, such as processing cores. As such, increasing the size of the bottom die provides additional space to stack a plurality of high performance cores in a single system. Therefore, embodiments of the invention allow for improved performance due to the increased number of processing cores that may be included in a single system.

Figure 1:
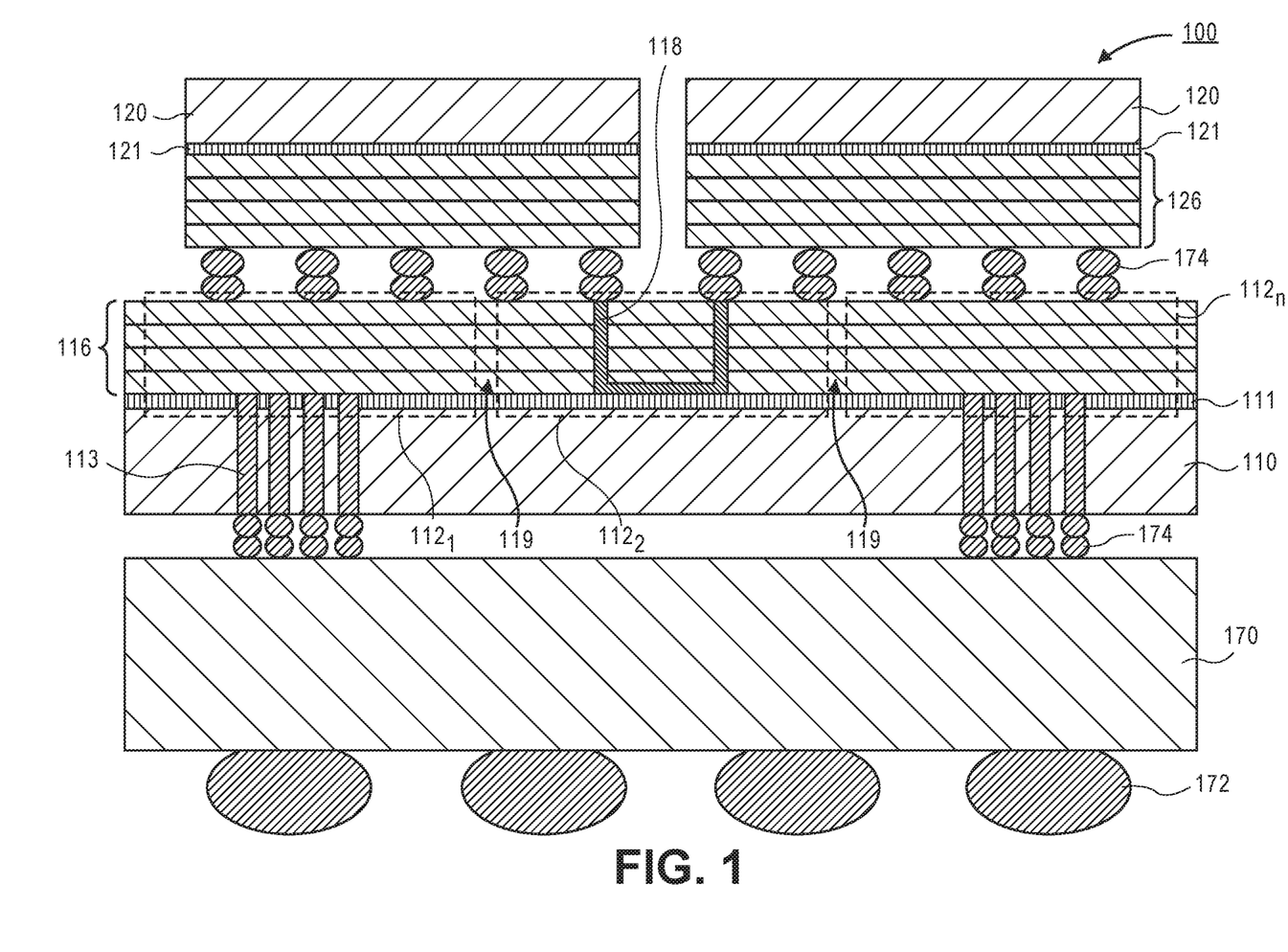
FIG. 1 is a cross-sectional illustration of a system that includes a plurality of stacked dies where the lower die is unstitched and larger than the reticle limit, according to an embodiment of the invention.

Referring now to FIG. 1, a cross-sectional illustration of a stacked die system 100 is shown according to an embodiment of the invention. According to an embodiment, the stacked die system 100 may include a first die 110 that is mounted onto a packaging substrate 170. The first die 110 may be mounted onto the packaging substrate 170 with any suitable interconnect 174, such as solder bumps, controlled collapse chip connection (C4) bumps, or the like. The packaging substrate 170 may be any suitable packaging substrate known in the art, such as a cored or coreless packaging substrate. In the illustrated embodiment, the packaging substrate 170 may also include a plurality of solder bumps 172 for connecting the packaging substrate to a mother board or the like (not shown).

In an embodiment, the first die 110 may include any semiconductor material. For example the semiconductor material may be a crystalline substrate formed using a bulk silicon or a silicon-on-insulator substructure. In other implementations, the semiconductor material may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the first die 110 may be formed are described here, any material that may serve as a foundation upon which a semiconductor device may be built falls within the scope of the present invention.

In an embodiment the first die 110 may include an active device layer 111 that includes integrated circuitry. In some embodiments, the active device layer 111 of the first die 110 may include integrated circuitry that is used for processing operations that require lower processing speeds compared to processing operations that will be implemented in the plurality of second dies 120, described in greater detail below. In an embodiment, a plurality of vias 113 may communicatively couple the active device layer 111 to the bumps 174 on the opposite side of the first die 110. For example, the vias 113 may be through silicon vias (TSVs) or the like.

In an embodiment, a plurality of routing layers 116 may be formed over the active device layer 111. For example, the routing layers 116 may include a plurality of conductive routing lines and vias (not shown) formed within a plurality of dielectric layers, as is known in the art. According to an embodiment, the plurality of routing layers may be formed with typical lithographic and deposition processes. However, in embodiments of the invention the footprint of the first die 110 is larger than the reticle limit used to pattern the routing layers 116. As such, embodiments include a plurality of routing layers that are separated into a plurality of sub regions $112_1$-$112_n$. In an embodiment each sub region 112 may be substantially the same size as the reticle limit.

Accordingly, multiple exposures made while stepping a reticle over the surface of the first die 110 may allow for the first die 110 to be larger than the reticle limit. In an embodiment, each of the sub regions 112 in the first die 110 are not stitched together with additional masking and patterning. As such, conductive traces in the routing layers 116 may not pass over the boundaries 119 between the sub regions 112. For example, the die to die interconnect 118 is formed entirely within the sub region $112_2$ and communicatively couples the two second dies 120 mounted over the first die 110. For clarity, the only conductive trace illustrated in the routing layers 116 in FIG. 1 is the die to die interconnect 118, though it is to be appreciated that many other conductive traces may be included in the routing layers 116. Additionally, while the die to die interconnect line 118 is illustrated as two vias that connect to a trace on the bottommost routing layer of the routing layers 116, it is to be appreciated that the vias and routing layer may be formed in any of the layers.

The ability to form first dies 110 that have a larger footprint than the reticle limit provides a larger surface on which to mount second dies 120. In an embodiment, the second dies 120 may be fabricated with different processing technology than the first dies 110. In an embodiment, the second dies 120 may be an advanced processing technology relative to the first die 110. For example, the second dies 120 may be high performance dies, such as processing cores or the like. In an embodiment, the second dies 120 may include a semiconductor substrate and a device layer 121.

According to an embodiment, the semiconductor substrate of the second dies 120 may be the same semiconductor material as the first semiconductor die 110 or the second dies 120 may include a different semiconductor material than the first die 110. For example, the first semiconductor die 110 may be silicon and the second semiconductor dies 120 may be a III-V semiconductor. In an embodiment, each of the second semiconductor dies 120 may be substantially similar to each other. Alternative embodiments may include second semiconductor dies 120 that are not all substantially similar to each other.

Even though the sub regions 112 of the first die 110 are not stitched together, embodiments of the invention allow for the second dies 120 to be communicatively coupled. In an embodiment, the second dies 120 may be communicatively coupled by the die to die interconnect 118 in the first die 110. For example, bumps 172 on each of the second dies 120 may be attached to portions of the die to die interconnect 118. Accordingly, signals may pass over the reticle boundary 119 in the first die 110, even though no stitching is present between the sub regions 112.

Figure 2:
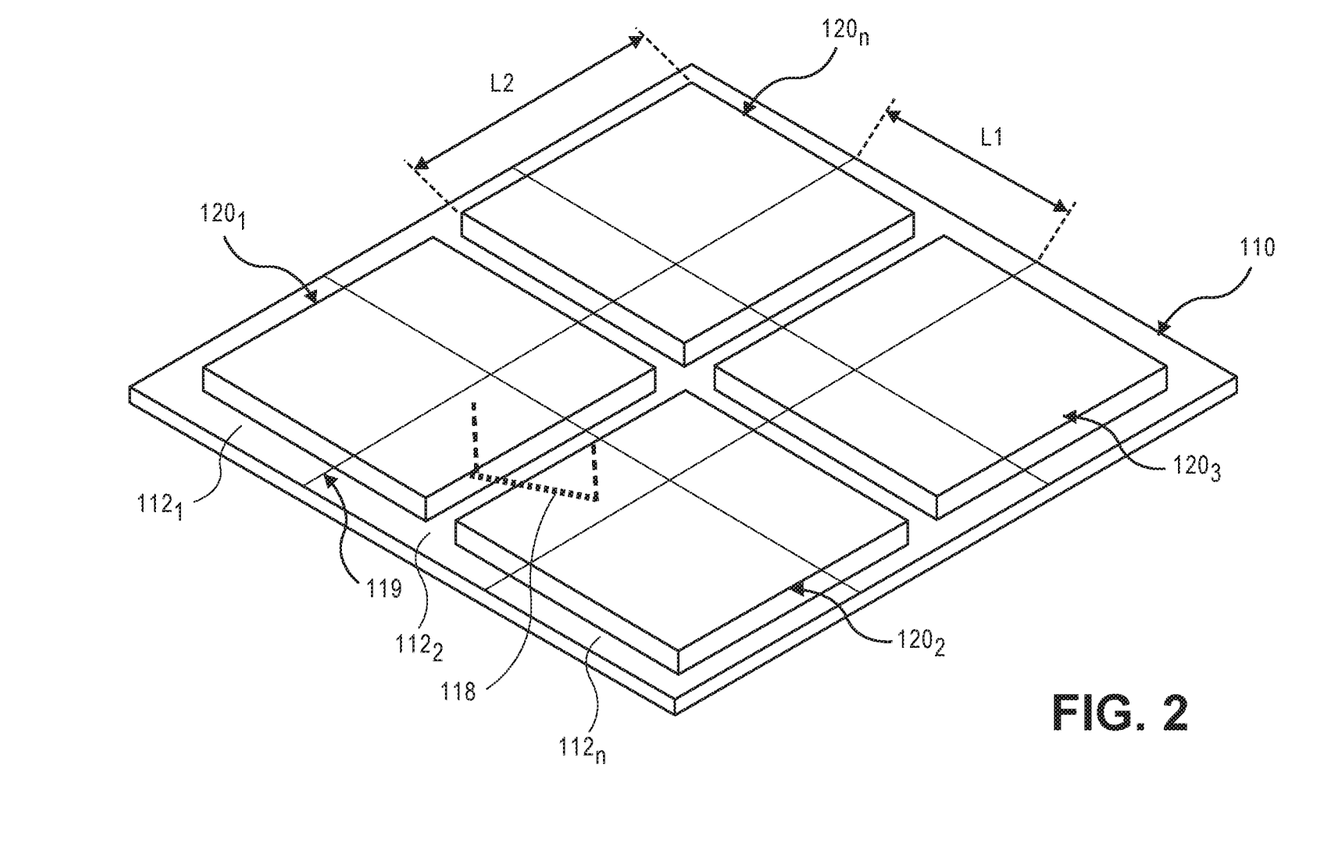
FIG. 2 is a perspective illustration of a system that includes a plurality of stacked dies where a die to die interconnect line formed entirely in one sub region of the bottom die is shown, according to an embodiment of the invention.

Referring now to FIG. 2, a perspective view of a stacked die system with a plurality of second dies $120_1$-$120_n$ stacked on a first die 110 is shown, according to an embodiment of the invention. FIG. 2 more clearly illustrates size and arrangement of the sub regions $112_1$-$112_n$ of the first die 110. In the illustrated embodiment, the first die 110 includes nine sub regions 112 arranged in a three by three pattern. However, it is to be appreciated that the first die 110 may include any number of sub regions 112 and the sub regions 112 may be arranged in any desired pattern. In the illustrated embodiment, four second dies $120_1$-$120_n$ are stacked on the first die 110 in a two by two arrangement. However, it is to be appreciated that any number of second dies 120 may be used and they may be arranged in any desired pattern.

In an embodiment, the second dies 120 may be arranged on the first die 110 so that they cross over a boundary region 119 between sub regions 112 of the first die 110. Additionally, embodiments of the invention may include one or more of second dies 120 that have a larger footprint than a footprint of the sub regions 112. For example, as illustrated in FIG. 2, the length L2 of a side of a second die 120 may be greater than a length L1 of a sub region 112. While the second dies 120 may be larger (area wise) than each sub region 112 of the first die 110, it is to be appreciated that the second dies 120 may not be larger than the reticle limit used to fabricate the second dies 120. This is possible because embodiments of the invention do not require the first die 110 and the second dies 120 to be processed on the same wafer. Accordingly, the first die 110 and the second dies 120 may be fabricated with different semiconductor processing equipment and/or with different processing technologies. This may be particularly beneficial when the first die 110 is used for low speed operations and, therefore, does not require advanced processing techniques that may be needed for second dies 120 that are used for high speed operations. Therefore, the decoupled processing allows for improved efficiencies because the more expensive advanced processing technologies may only be used to fabricate the higher performance second dies 120, whereas the less expensive processing technologies may be used to fabricate the lower performance first die 110.

In order to provide die-to-die communication between two of the second dies 120, embodiments of the invention may include die-to-die interconnects formed in a single sub region 112 of the first die 110. For example, a conductive trace and vias 118 (schematically represented as a dashed line) may be patterned in a single sub region 112 of the first die 110. As illustrated in FIG. 2, second die $120_1$ and second die $120_2$ are communicatively coupled by conductive traces and vias 118. The conductive trace and vias 118 are formed entirely in sub region $112_2$ of the first die, and provide a connection between second die $120_1$ and second die $120_2$. As such, the conductive trace and vias 118 may be formed without needing additional mask layers to stitch across the boundary regions 119 between sub regions 112. While a single die to die interconnect 118 is shown in sub region $112_2$, it is to be appreciated that any number of the sub regions 112 may include die to die interconnects 118 and/or any number of the die to die interconnects may be formed in each sub region 112.

Figure 3A:
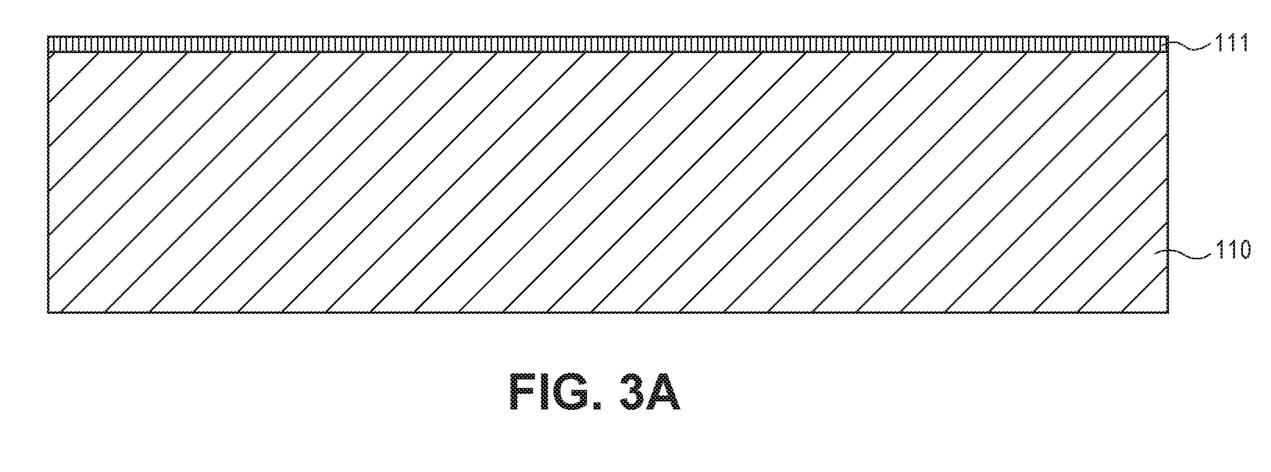
FIG. 3A is a cross-sectional illustration of a first die after the front end of line processing has been completed, according to an embodiment of the invention.

Referring now to FIGS. 3A-3F a process flow for forming a stacked die system where the first die is an unstitched die with sub portions that are larger than the reticle limit is shown, according to an embodiment of the invention. In FIG. 3A, a cross-sectional illustration of first die 110 is shown. In an embodiment, a device layer 111 may be formed on the first die 110. For example, the device layer 111 may include transistors, diodes, or any other circuit elements (not shown), as is known in the art. The device layer 111 may be fabricated with typical front end of line (FEOL) semiconductor processing technologies.

Figure 3B:
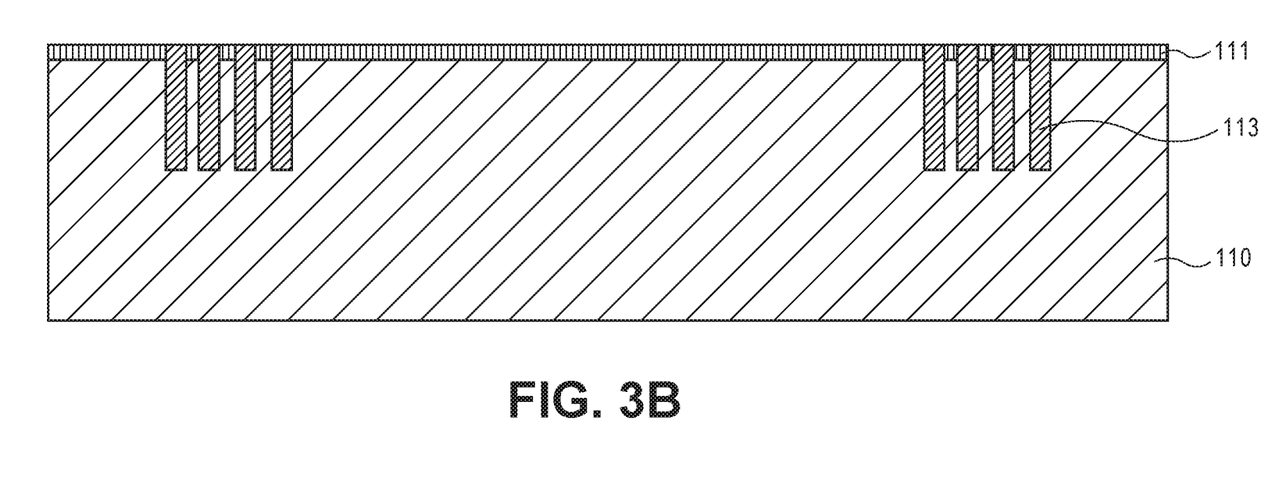
FIG. 3B is a cross-sectional illustration of the first die after through silicon vias are formed in the first die, according to an embodiment of the invention.

Referring now to FIG. 3B, a cross-sectional illustration of the first die 110 after a plurality of vias 113 are formed into the first die 110 is shown, according to an embodiment of the invention. In an embodiment, the vias 113 may be formed by etching a trench into the semiconductor substrate of the first die 110 and disposing a conductive material into the trenches. While not shown in FIG. 3B, embodiments may also include forming a diffusion barrier between the conductive material and the semiconductor material in order to minimize diffusion of the conductive material into the semiconductor material.

Figure 3C:
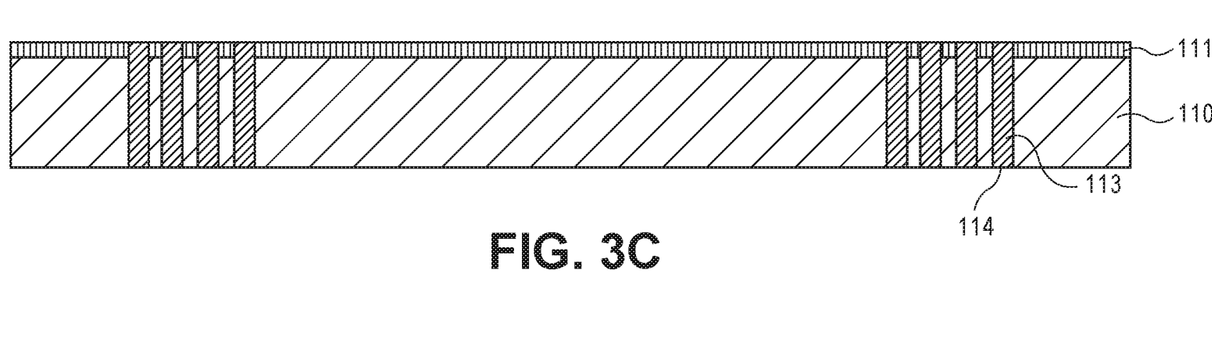
FIG. 3C is a cross-sectional illustration of the first die after the thickness of the semiconductor substrate is reduced to expose the through silicon vias, according to an embodiment of the invention.

Referring now to FIG. 3C, a cross-sectional illustration of the first die 110 after the first die 110 has been thinned is shown, according to an embodiment of the invention. Thinning the first die 110 exposes a surface 114 of the vias 113. As such, the vias 113 may electrically couple opposing sides of the first die 110 and allow for the stacking of subsequent dies, as will be described in greater detail below.

Figure 3D:
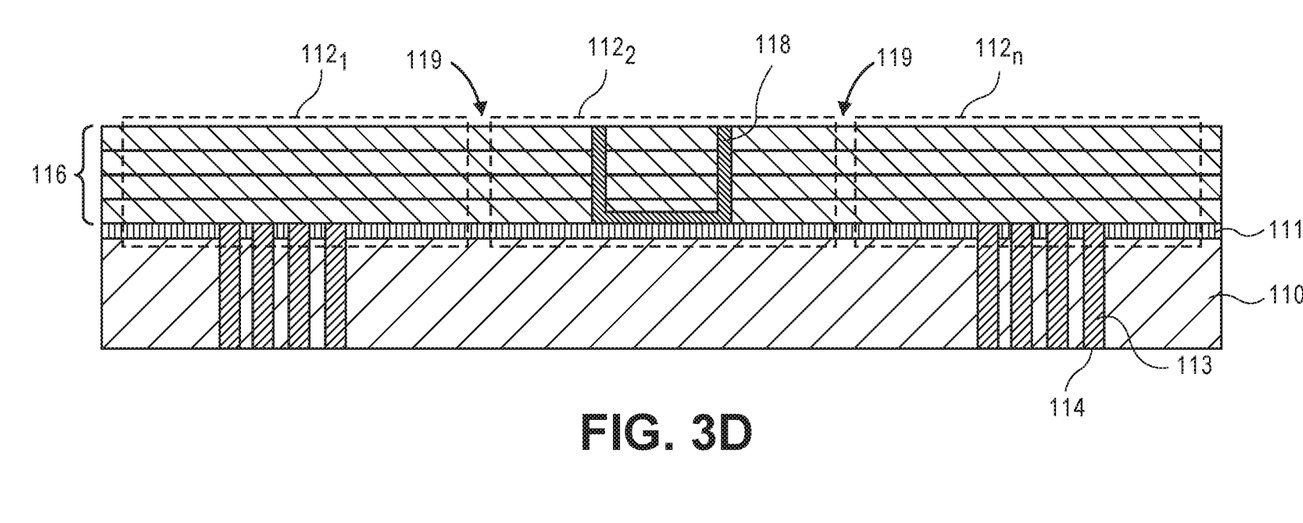
FIG. 3D is a cross-sectional illustration of the first die after a plurality of interconnect layers have been formed over the device layer, according to an embodiment of the invention.

Referring now to FIG. 3D, a cross-sectional illustration of the first die 110 is shown after routing layers 116 are formed over the device layer 111, according to an embodiment of the invention. According to an embodiment, the footprint of the first die is greater than the reticle limit. Accordingly, the first die is fabricated with multiple exposures of sub regions 112. For example, for each layer of the routing layers 116, a reticle may be positioned over a sub region 112 and that sub region is exposed. The process may be repeated with each sub region being individually exposed with a reticle. In an embodiment, each sub region 112 may include conductive traces and vias for routing. However, for clarity and in order to not obscure embodiments of the invention, the routing lines other than the die to die interconnect 118 are omitted. In an embodiment, the die to die interconnect 118 may be used to communicatively couple two second dies that will be mounted over the first die 110. According to an embodiment, the die to die interconnect 118 is formed entirely within a single sub region $112_2$. As such, no stitching is needed to form the die to die interconnect 118 since the interconnect 118 never crosses over a reticle boundary 119 between sub regions 112. While the die to die interconnect 118 is shown in a single sub region 112, it is to be appreciated that any number of the sub regions 112 may include die to die interconnects 118, and/or any number of die to die interconnects 118 may be formed in a single sub region 112. Additionally, while the die to die interconnect 118 is illustrated as two vias that connect to a trace on the bottommost layer of the routing layers 116, it is to be appreciated that the vias and routing layer may be formed in any layer of the routing layers 116. In some embodiments, the die to die interconnect 118 may be formed on the topmost layer of the routing layers 116, and therefore, may only require a conductive trace and the vias may be omitted.

Figure 3E:
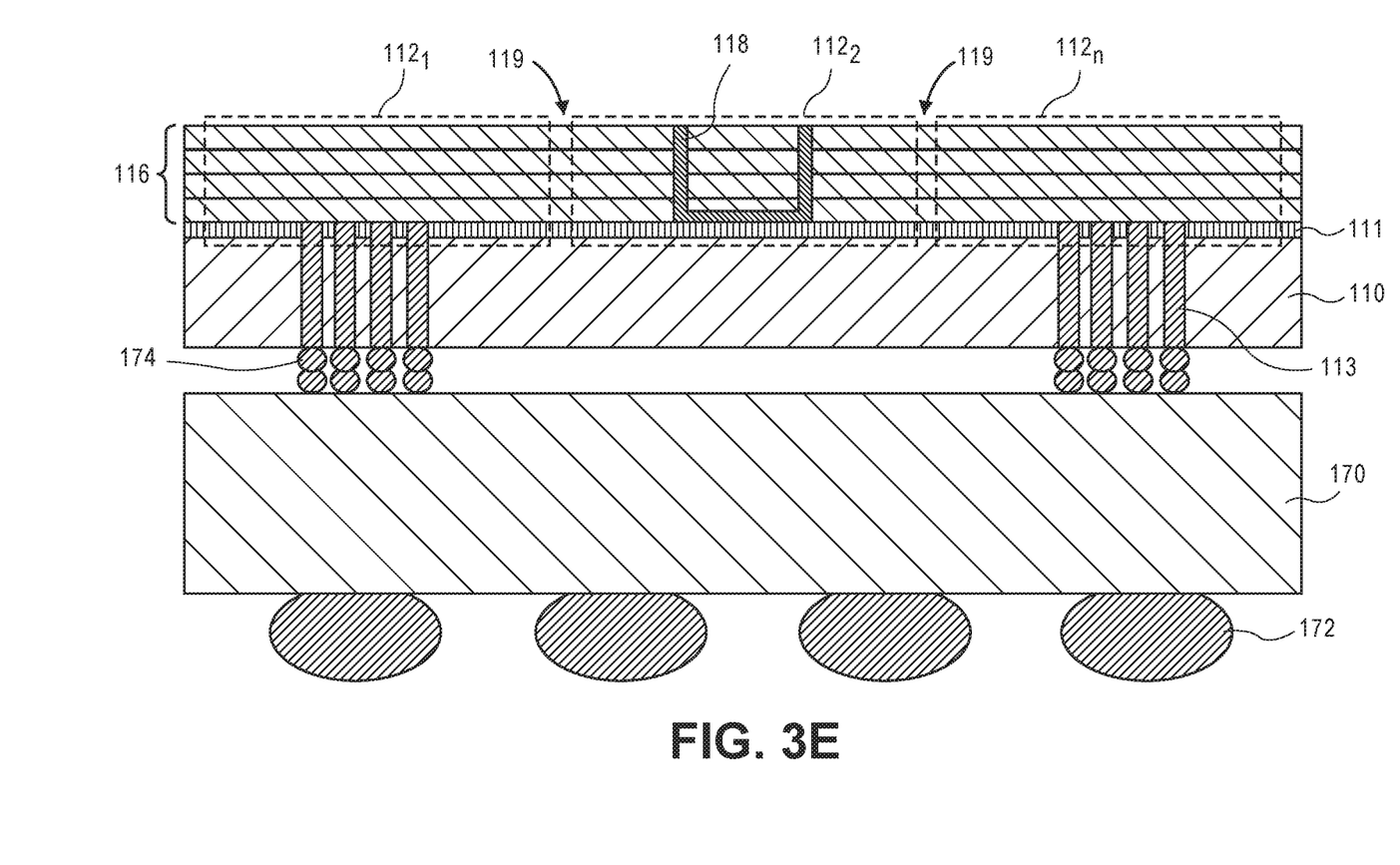
FIG. 3E is a cross-sectional illustration after the first die is mounted to a packaging substrate, according to an embodiment of the invention.

Referring now to FIG. 3E, a cross-sectional illustration of the first die 110 is shown after the first die 110 is mounted to a packaging substrate 170, according to an embodiment of the invention. In an embodiment, the first die 110 may be diced (i.e., singulated from a wafer that includes a plurality of first dies 110) prior to being mounted on the packaging substrate 170. In an embodiment, the first die 110 may be mounted to the packaging substrate 170 with a plurality of bumps 174 (e.g., solder bumps, C4 bumps, or the like). Embodiments may also include a packaging substrate 170 that includes a plurality of solder bumps 172 formed on a surface of the packaging substrate 170 facing away from the first die 110. For example, the solder bumps 172 may be used to mount the packaging substrate to another substrate, such as a printed circuit board (PCB), motherboard, or the like.

Figure 3F:
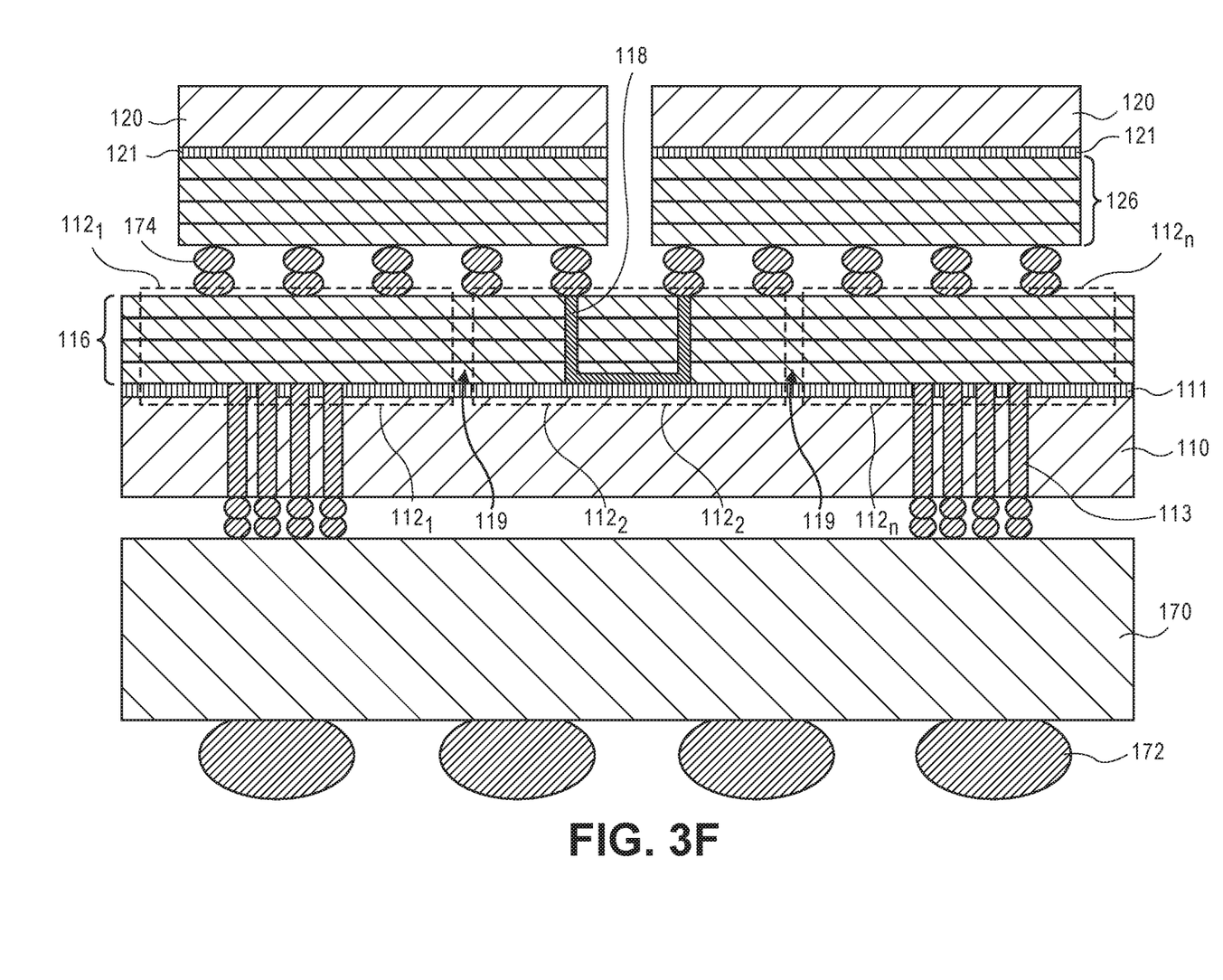
FIG. 3F is a cross-sectional illustration after a plurality of second dies are mounted onto the first die, according to an embodiment of the invention.

Referring now to FIG. 3F, a cross-sectional illustration of the first die 110 is shown after a plurality of second dies 120 have been mounted to a surface of the first die 110, according to an embodiment of the invention. In an embodiment, the plurality of second dies 120 may be mounted to the first die with known interconnects 174, such as solder bumps, C4 bumps, or the like. In an embodiment, the plurality of second dies 120 may be higher performance processing dies compared to the first die 110. In some embodiments, each of the second dies 120 may be substantially similar to each other. Other embodiments may include second dies 120 that are not all substantially similar to each other.

As illustrated in FIG. 3F, the second dies 120 may be positioned over the first die 110 such that the footprint of the second die 120 crosses over the boundary region 119 between sub regions of the first die 110. In an embodiment, the die to die connection 118 may communicatively couple two of the second dies 120. In order to eliminate the need for die stitching, the die to die connection 118 may be fabricated in a single sub region 112 of the first die 110. For example, in FIG. 3F, the die to die interconnect 118 is entirely formed within the second sub region $112_2$. Since portions of each second die 120 overlap at least a portion of the second sub region $112_2$, the die to die interconnect 118 may be formed between the two second dies 120 without needing a conductive trace that extends beyond the edge of the sub region $112_2$. In the illustrated embodiment, solder bumps 174 coupled to each of the second dies 120 may be electrically coupled to the die to die interconnect 118 formed on the first die 110. While the innermost solder bumps 174 on each of the second dies 120 are shown as being connected to the die to die interconnect 118, it is to be appreciated that any of the solder bumps 174 may be coupled to the die to die connection 118 so long as the bumps 174 are positioned over at least a portion of the same sub region 112, according to other embodiments.

Figure 4:
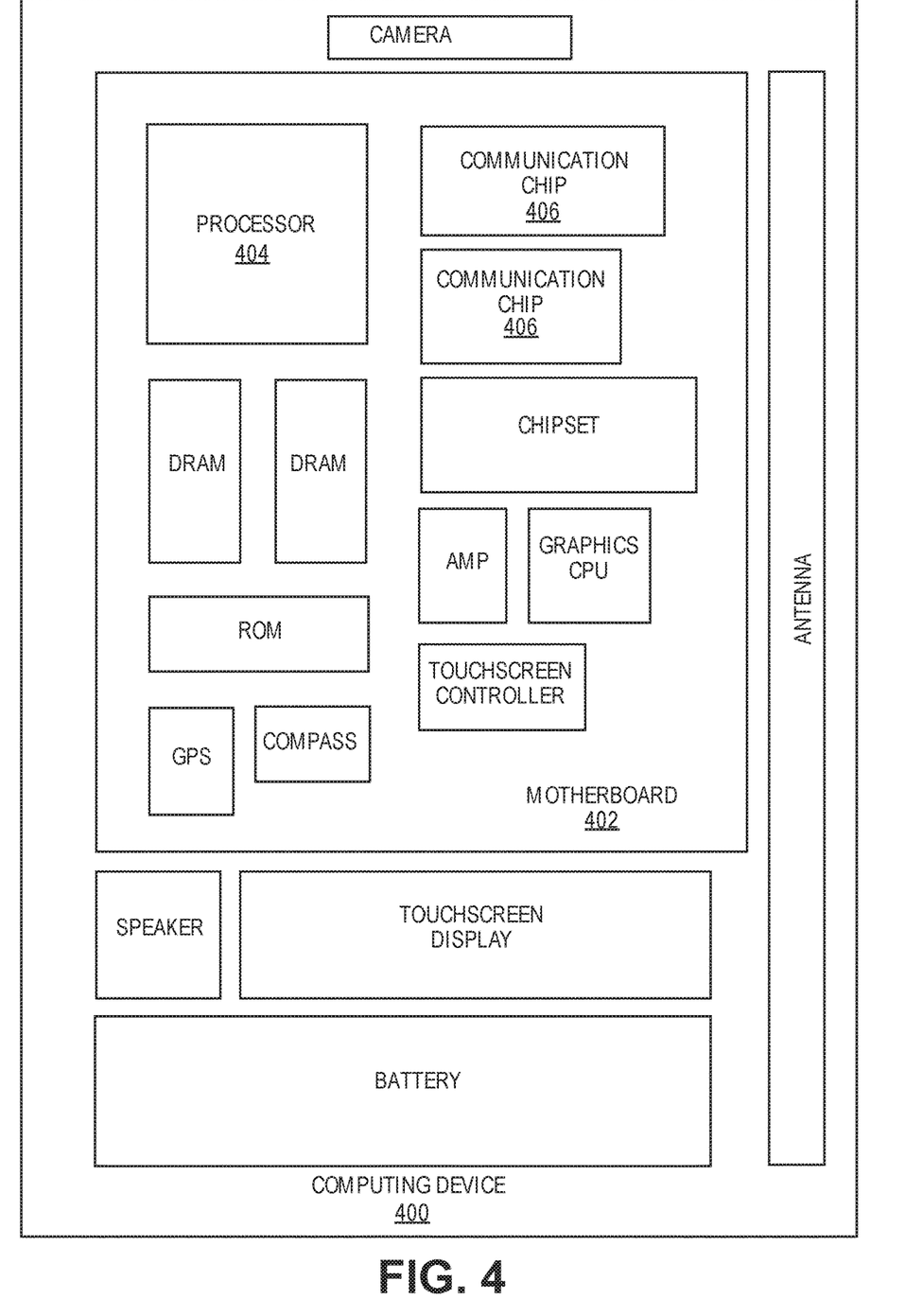
FIG. 4 is a schematic of a computing device built in accordance with an embodiment of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor may include a stacked die system including an unstitched first die and a plurality of second dies stacked over the first die, in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip may include a stacked die system including an unstitched first die and a plurality of second dies stacked over the first die, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a stacked die system, comprising: first die, wherein the first die comprises: a device layer; and a plurality of routing layers formed over the device layer, wherein the plurality of routing layers are segmented into a plurality of sub regions, and wherein no conductive traces in the plurality of routing layers pass over a boundary between any of the plurality of sub regions; and a plurality of second dies stacked over the first die, wherein one or more of the second dies cross over the boundary between any of the plurality of sub regions.

Example 2: the stacked die system of Example 1, wherein at least two of the second dies are positioned over at least a portion of the same sub region of the first die.

Example 3: the stacked die system of Example 2, wherein the two second dies are communicatively coupled to each other by a die to die interconnect formed entirely within the sub region of the first die that the two second dies are positioned at least partially over.

Example 4: the stacked die system of Example 1, Example 2, or Example 3, wherein a footprint of each of the second dies is larger than a footprint of the sub regions of the first die.

Example 5: the stacked die system of Example 1, Example 2, Example 3, or Example 4, wherein second dies are mounted to the first die with a controlled collapse chip connection.

Example 6: the stacked die system of Example 1, Example 2, Example 3, Example 4, or Example 5, wherein the plurality of second dies are high speed processing dies relative to the first die.

Example 7: the stacked die system of Example 6, wherein the second dies are processing cores.

Example 8: the stacked die system of Example 1, Example 2, Example 3, Example 4, Example 5, or Example 6, wherein the plurality of second dies are formed on a different semiconductor material than the first die.

Example 9: the stacked die system of Example 8, wherein the plurality of second dies are formed on a III-V semiconductor substrate, and the first die is formed on a silicon substrate.

Example 10: the stacked die system of Example 1, Example 2, Example 3, Example 4, Example 5, Example 6, Example 7, Example 8, or Example 9, wherein the sub regions on the first die are arranged in a three by three pattern, and wherein there are four second dies.

Example 11: a method for forming a stacked die system, comprising: forming an active device layer on a first semiconductor die; forming a plurality of routing layers over a surface of the active device layer, wherein the routing layers are segmented into a plurality of sub regions, and wherein no conductive traces in the plurality of routing layers pass over a boundary between any of the plurality of sub regions; and mounting a plurality of second dies onto the first die.

Example 12: the method of Example 11, wherein the first die has a footprint that is larger than a reticle limit of the processing used to form the plurality of routing layers.

Example 13: the method of Example 11 or Example 12, wherein forming the routing layers includes individually exposing each sub region with a reticle, and wherein no two sub regions are simultaneously exposed with a single reticle.

Example 14: the method of Example 11, Example 12, or Example 13, wherein at least two of the second dies are mounted over at least a portion of the same sub region of the first die.

Example 15: the method of Example 14, wherein the two second dies are communicatively coupled to each other by a die to die interconnect formed entirely within a single sub region of the first die.

Example 16: the method of Example 11, Example 12, Example 13, Example 14, or Example 15, further comprising: forming a plurality of vias through the first die, wherein the vias communicatively couple the device layer of the first die to a surface of the first die opposite to the device layer; and mounting the first die to a packaging substrate, wherein the device layer of the first die is formed on a surface of the first die facing away from a surface of the packaging substrate.

Example 17: the method of Example 11, Example 12, Example 13, Example 14, Example 15, or Example 16, wherein the plurality of second dies are fabricated with advanced processing technology relative to the first die.

Example 18: the method of Example 17, wherein the second dies are cores.

Example 19: the method of Example 17 or Example 18, wherein a footprint of each of the second dies is greater than a footprint of each of the sub regions on the first die.

Example 20: the method of Example 11, Example 12, Example 13, Example 14, Example 15, Example 16, Example 17, Example 18, or Example 19, wherein the plurality of sub regions includes nine or more sub regions, and wherein the plurality of second dies includes four or more second dies.

Example 21: a stacked die system, comprising: a first die, wherein the first die comprises: a device layer; a plurality of routing layers formed over the device layer, wherein the plurality of routing layers are segmented into a plurality of sub regions, and wherein no conductive traces in the plurality of routing layers pass over a boundary between any of the plurality of sub regions; and a plurality of vias through the first die, wherein the vias electrically couple the device layer with a surface of the die opposite to the device layer; a plurality of second dies stacked over the first die, wherein one or more of the second dies cross over the boundary between any of the plurality of sub regions, and wherein at least a first of the second dies are communicatively coupled to at least a second of the second dies by a die to die interconnect formed entirely within a single sub region in the first die; and a packaging substrate communicatively coupled to a the plurality of vias in the first die.

Example 22: the stacked die system of Example 21, wherein a footprint of each of the second dies is larger than a footprint of the sub regions of the first die.

Example 23: the stacked die system of Example 21 or Example 22, wherein the plurality of second dies are high speed processing dies relative to the first die.

Example 24: the stacked die system of Example 21, Example 22, or Example 23, wherein the second dies are processing cores.

Example 25: the stacked die system of Example 21, Example 22, Example 23, or Example 24, wherein the sub regions on the first die are arranged in a three by three pattern, and wherein there are four second dies arranged in a two by two pattern.

What is claimed is:

1. A stacked die system, comprising:
    a first die, wherein the first die comprises:
        a device layer, the device layer comprising a plurality of transistors; and
        a plurality of routing layers formed over the device layer, wherein the plurality of routing layers are segmented into a plurality of sub regions, each sub region having a same size, and wherein no conductive traces in the plurality of routing layers pass over a boundary between any of the plurality of sub regions; and
    a plurality of second dies stacked over the first die, wherein one or more of the second dies cross over the boundary between any of the plurality of sub regions, and wherein each of the plurality of second dies has a footprint greater than a footprint of each of the plurality of sub regions.

2. The stacked die system of claim 1, wherein at least two of the second dies are positioned over at least a portion of the same sub region of the first die.

3. The stacked die system of claim 2, wherein the two second dies are communicatively coupled to each other by a die to die interconnect formed entirely within the sub region of the first die that the two second dies are positioned at least partially over.

4. The stacked die system of claim 1, wherein second dies are mounted to the first die with a controlled collapse chip connection.

5. The stacked die system of claim 1, wherein the plurality of second dies are high speed processing dies relative to the first die.

6. The stacked die system of claim 5, wherein the second dies are processing cores.

7. The stacked die system of claim 1, wherein the plurality of second dies are formed on a different semiconductor material than the first die.

8. The stacked die system of claim 7, wherein the plurality of second dies are formed on a III-V semiconductor substrate, and the first die is formed on a silicon substrate.

9. The stacked die system of claim 1, wherein the sub regions on the first die are arranged in a three by three pattern, and wherein there are four second dies.

10. A method for forming a stacked die system, comprising:
    forming an active device layer on a first semiconductor die, the active device layer comprising a plurality of transistors;
    forming a plurality of routing layers over a surface of the active device layer, wherein the routing layers are segmented into a plurality of sub regions, each sub region having a same size, and wherein no conductive traces in the plurality of routing layers pass over a boundary between any of the plurality of sub regions; and
    mounting a plurality of second dies onto the first die, wherein each of the plurality of second dies has a footprint greater than a footprint of each of the plurality of sub regions.

11. The method of claim 10, wherein the first die has a footprint that is larger than a reticle limit of the processing used to form the plurality of routing layers.

12. The method of claim 11, wherein forming the routing layers includes individually exposing each sub region with a reticle, and wherein no two sub regions are simultaneously exposed with a single reticle.

13. The method of claim 10, wherein at least two of the second dies are mounted over at least a portion of the same sub region of the first die.

14. The method of claim 13, wherein the two second dies are communicatively coupled to each other by a die to die interconnect formed entirely within a single sub region of the first die.

15. The method of claim 10, further comprising:
forming a plurality of vias through the first die, wherein the vias communicatively couple the device layer of the first die to a surface of the first die opposite to the device layer; and
mounting the first die to a packaging substrate, wherein the device layer of the first die is formed on a surface of the first die facing away from a surface of the packaging substrate.

16. The method of claim 10, wherein the plurality of second dies are fabricated with advanced processing technology relative to the first die.

17. The method of claim 16, wherein the second dies are cores.

18. The method of claim 10, wherein the plurality of sub regions includes nine or more sub regions, and wherein the plurality of second dies includes four or more second dies.

19. A stacked die system, comprising:
a first die, wherein the first die comprises:
a device layer, the device layer comprising a plurality of transistors;
a plurality of routing layers formed over the device layer, wherein the plurality of routing layers are segmented into a plurality of sub regions, each sub region having a same size, and wherein no conductive traces in the plurality of routing layers pass over a boundary between any of the plurality of sub regions; and
a plurality of vias through the first die, wherein the vias electrically couple the device layer with a surface of the die opposite to the device layer;
a plurality of second dies stacked over the first die, wherein one or more of the second dies cross over the boundary between any of the plurality of sub regions, wherein at least a first of the second dies are communicatively coupled to at least a second of the second dies by a die to die interconnect formed entirely within a single sub region in the first die, and wherein each of the plurality of second dies has a footprint greater than a footprint of each of the plurality of sub regions; and
a packaging substrate communicatively coupled to the plurality of vias in the first die.

20. The stacked die system of claim 19, wherein the plurality of second dies are high speed processing dies relative to the first die.

21. The stacked die system of claim 20, wherein the second dies are processing cores.

22. The stacked die system of claim 19, wherein the sub regions on the first die are arranged in a three by three pattern, and wherein there are four second dies arranged in a two by two pattern.

23. A method for forming a stacked die system, comprising:
forming an active device layer on a first semiconductor die;
forming a plurality of routing layers over a surface of the active device layer, wherein the routing layers are segmented into a plurality of sub regions, wherein no conductive traces in the plurality of routing layers pass over a boundary between any of the plurality of sub regions, wherein the first die has a footprint that is larger than a reticle limit of the processing used to form the plurality of routing layers, and wherein forming the routing layers includes individually exposing each sub region with a reticle, and wherein no two sub regions are simultaneously exposed with a single reticle; and
mounting a plurality of second dies onto the first die.

\* \* \* \* \*